(12) United States Patent
Mikami

(10) Patent No.: US 6,531,336 B1
(45) Date of Patent: Mar. 11, 2003

(54) SEMICONDUCTOR APPARATUS, METHOD OF FABRICATING THEREOF, FABRICATING APPARATUS, CIRCUIT BOARD, AND ELECTRONIC DEVICE

(75) Inventor: Kunimitsu Mikami, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 198 days.

(21) Appl. No.: 09/695,998

(22) Filed: Oct. 26, 2000

(30) Foreign Application Priority Data

Oct. 29, 1999 (JP) .......................................... 11-309031

(51) Int. Cl.[7] .................. H01L 21/44; H01L 21/48; H01L 21/50
(52) U.S. Cl. .................. 438/106; 438/123; 438/617
(58) Field of Search .................. 438/106, 110, 438/111, 121, 123, 611, 612, 617; 228/4.5, 180.5; 257/678, 666, 784

(56) References Cited

U.S. PATENT DOCUMENTS 5,322,207 A * 6/1994 Fogal et al. ............. 228/180.5
5,904,500 A * 5/1999 Tay ............................. 257/676
6,000,599 A * 12/1999 Ball et al. ................. 228/180.5
6,070,780 A * 6/2000 Shimura et al. ............. 228/4.5

FOREIGN PATENT DOCUMENTS

JP 363025937 A * 2/1988
JP 403206331 A * 9/1991

* cited by examiner

Primary Examiner—Olik Chaudhuri
Assistant Examiner—Hoai Pham
(74) Attorney, Agent, or Firm—Oliff & Berridge, PLC

(57) ABSTRACT

Thermal oxidation of lead frames is provided to thereby improve the adhesion with resin. The method includes the steps of disposing a lead frame having die pads on which semiconductor chips are respectively mounted in a bonding apparatus, and wire-bonding electrodes of the semiconductor chips and leads of the lead frame. The bonding apparatus includes a bonding stage and a stand-by stage. A heat section is provided in the bonding stage. The die pad of the lead frame is disposed in the bonding stage and the remaining die pads are disposed in the stand-by stage. The die pads disposed in the stand-by stage are placed in a non-contact state with the heat section, while the die pad disposed in the bonding stage is brought in contact with the heat section to be heated and wire-bonded.

8 Claims, 3 Drawing Sheets

SEMICONDUCTOR APPARATUS, METHOD OF FABRICATING THEREOF, FABRICATING APPARATUS, CIRCUIT BOARD, AND ELECTRONIC DEVICE

BACKGROUND OF THE INVENTION

1. Field of the Invention

The present invention relates to semiconductor apparatuses and fabricating methods, fabricating apparatuses, circuit boards and electronic devices relating to the same.

2. Description of Related Art

As one type of packages for semiconductor devices, QFP (Quad Flat Package) in which a semiconductor chip is mounted on a lead frame is known. More specifically, a semiconductor chip is mounted on a die pad of a lead frame, and electrodes of the semiconductor chip are wire-bonded to leads of the lead frame. Also, the entire semiconductor chip is covered by a resin. It is noted that lead frames are often made from copper.

SUMMARY OF THE INVENTION

In general, in the wire-bonding process, a lead frame that mounts a plurality of semiconductor chips is transported and the bonding is performed over heat sections that are heated at high temperatures over 200° C. More specifically, the heat sections are provided at a bonding stage where the wire-bonding is performed and a stand-by stage where the die pads of the lead frame are held before being transferred to the bonding stage. In the stand-by stage, the lead frame is brought in contact with the heat section and heated.

Therefore, since the lead frame is heated not only in the bonding stage for the wire-bonding work but also in the stand-by stage, oxide films would be formed on the lead frame after the bonding process is completed. The oxide films could deteriorate the adhesion of the resin that seals the lead frame and the semiconductor chip, and could lower the reliability of the semiconductor device.

The present invention solve the problems described above, and it is an object of the present invention to provide a reliable semiconductor device and a manufacturing method, a manufacturing apparatus, a circuit substrate and an electronic apparatus relating to the same by suppressing the oxidation of a lead frame to thereby improve the adhesion of resin with the lead frame.

DESCRIPTION OF THE INVENTION (1) A method for manufacturing a semiconductor device in accordance with the present invention may include the steps of:

disposing a lead frame having a plurality of die pads on which semiconductor chips are respectively mounted in a bonding apparatus, and wire-bonding electrodes of the semiconductor chips and leads of the lead frame, wherein the bonding apparatus includes a bonding stage and a stand-by stage, and a heat section is provided at least in the bonding stage among the bonding stage and the stand-by stage, disposing at least one of the die pads of the lead frame in the bonding stage and the remaining die pads in the stand-by stage, and placing the die pads disposed in the stand-by stage in a non-contact state with the heat section, while the die pad disposed in the bonding stage is brought in contact with the heat section to be heated and wire-bonded.

In accordance with the present invention, while the die pad disposed in the bonding stage is wire-bonded, the die pads in the stand-by stage are placed in a non-contact state with respect to the heat section. In other words, the heat of the heat section for wire-bonding can be prevented from being directly applied to the lead frame that is placed in the stand-by stage. As a result, for example, the growth of an oxide film that may be formed in rear surfaces of the die pads of the lead frame can be suppressed, and the adhesion between the rear surfaces of the die pads and the resin can be improved. Accordingly, highly reliable semiconductor devices can be manufactured.

(2) In the method for manufacturing a semiconductor device, side sections of the lead frame may be supported, and the die pads placed in the stand-by stage may be placed in a non-contact state with the heat section.

As a result of supporting the side sections of the lead frame, the die pads in the stand-by stage are placed in a non-contact state with the heat section, while the die pad placed in the bonding stage is bonded. Therefore, the growth of oxide films that are formed on the rear surfaces of the die pads can be suppressed, and highly reliable semiconductor devices can be,manufactured.

(3) In the method for manufacturing a semiconductor device, the lead frame can contain copper.

(4) A semiconductor device in accordance with the present invention is manufactured by the above-described method for manufacturing a semiconductor device.

(5) A circuit substrate in accordance with the present invention has the above-described semiconductor device mounted thereon.

(6) An electronic apparatus in accordance with the present invention includes the above-described semiconductor device.

(7) A manufacturing apparatus for manufacturing a semiconductor device in accordance with the present invention includes:

a bonding stage for wire-bonding electrodes of semiconductor chips mounted on die pads of a lead frame with leads of the lead frame; and a stand-by stage for, while at least one of die pads of the lead frame is wire-bonded in the bonding stage, disposing the remaining die pads of the lead frame, wherein a heat section is provided at least in the bonding stage among the bonding stage and the stand-by stage, and the heat section may be provided in a manner that it is placed in a non-contact state with the remaining die pads of the lead frame disposed in the stand-by stage, when the heat section contacts the at least one of the die pads of the lead frame disposed in the bonding stage.

In accordance with the present invention, the heat section is provided in a manner that it is placed in a non-contact state with the die pads disposed in the stand-by stage, when it contacts the die pad disposed in the bonding stage. In other words, while the die pads placed in the bonding stage are brought in contact with the heat section to be heated and wire-bonded, the die pads placed in the stand-by stage are brought in a non-contact state with the heat section. As a result, the heat of the heat section for wire-bonding can be prevented from being directly applied to the lead frame that is placed in the stand-by stage. As a result, for example, the growth of an oxide film that may be formed in rear surfaces of the die pads of the lead frame can be suppressed, and the adhesion between the rear surfaces of the die pads and the resin can be improved. Accordingly, highly reliable semiconductor devices can be manufactured.

(8) In the method for manufacturing a semiconductor device, the heat sections are provided in the bonding stage and stand-by stage, wherein the heat section may be provided with a surface thereof opposing the lead frame in the stand-by stage being lower than a surface thereof opposing the lead frame in the bonding stage.

As a result, the heat of the heat section for wire-bonding can be prevented from being directly applied to the lead frame that is placed in the stand-by stage. As a result, for example, the growth of an oxide film that may be formed in rear surfaces of the die pads of the lead frame can be suppressed, and the adhesion between the rear surfaces of the die pads and the resin can be improved. Accordingly, highly reliable semiconductor devices can be manufactured.

DETAILED DESCRIPTION OF PREFERRED EMBODIMENTS

The present invention is applicable to a wire-bonding process for a lead frame having a plurality of die pads. Also, the composition of the lead frame is not limited to those including copper, but includes all of the materials that have conductivity.

First Embodiment

Figure 1:
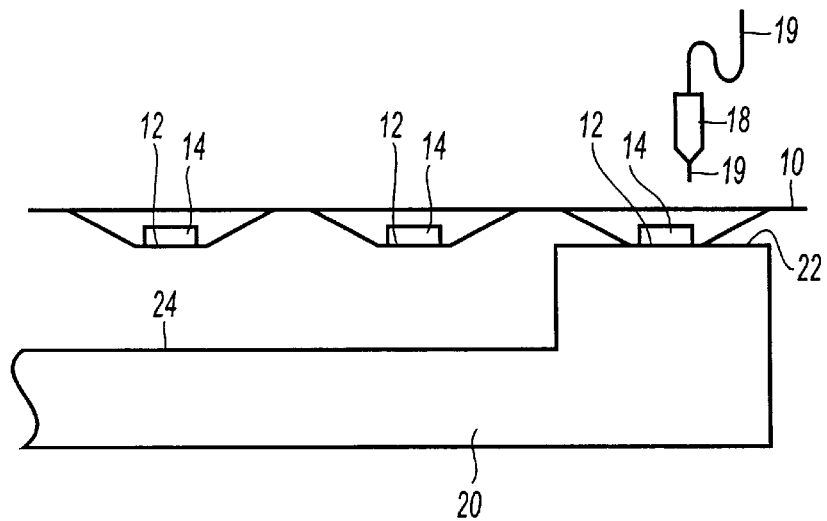
FIG. 1 shows a side view of an apparatus and a method for manufacturing a semiconductor device in accordance with an embodiment of the present invention.
Figure 2:
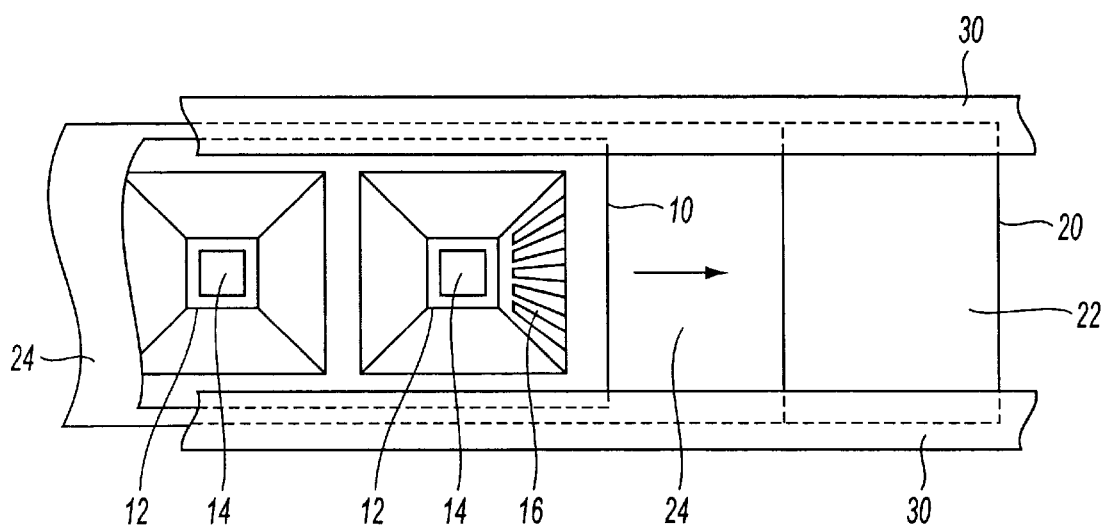
FIG. 2 shows a plan view of the apparatus and the method for manufacturing a semiconductor device in accordance with the embodiment of the present invention.
Figure 3:
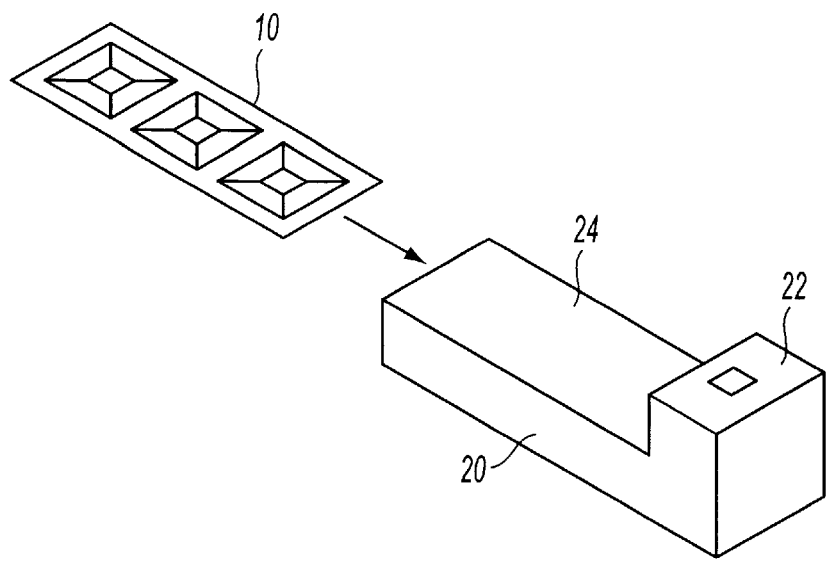
FIG. 3 shows a perspective view of the apparatus and the method for manufacturing a semiconductor device in accordance with the embodiment of the present invention.

FIGS. 1–3 show a manufacturing method and manufacturing apparatus for a semiconductor device in accordance with the present embodiment, and are a side view, a plan view and a perspective view thereof, respectively.

As shown in FIGS. 1–3, a lead frame 10 is disposed on a bonding apparatus, such that electrodes of semiconductor chips 14 mounted on a plurality of die pads 12 of the lead frame 10 are wire-bonded with leads 16 of the lead frame 10. More specifically, the bonding apparatus includes a bonding stage 22 and a stand-by stage 24, and at least one of the die pads 12 of the lead frame 10 disposed in the bonding stage 22 is wire-bonded.

The lead frame 10 has a plurality of patterns, each of the patterns being formed with a die pad 12 and a plurality of leads 16 (See FIG. 2). In general, from the viewpoint of the productivity, the lead frame 10 having a plurality of patterns, as described above, is processed in a state in which they are connected to each other.

The lead frame 10 is often formed from a copper-based metal, but is not limited to such metal as long as it has conductivity. Also, the lead frame 10 may be plated on its surface to improve its electrical characteristics.

The semiconductor chip 14 having a plurality of electrodes is mounted on each of the plurality of die pads 12 of the lead frame 10. The semiconductor chip 14 is affixed onto the die pad 12 by an adhesive or the like with its electrode-formed surface facing upward.

The bonding apparatus includes the bonding stage 22 and the stand-by stage 24. The bonding stage 22 provides a region where the wire-bonding is performed, and the stand-by stage 24 provides a region where, while at least one of the die pads 12 of the lead frame 10 is disposed in the bonding stage 22 and is wire-bonded, those of the die pads 12 to be transferred next can wait.

A heat section 20 is provided at least in the bonding stage 22 among the bonding stage 22 and the stand-by stage 24. The heat section 20 has a heating device. More specifically, the heat section 20 can be anything that can heat, or anything in which heat is transferred from a heat source. The heat section 20 contacts at least one of the die pads 12 of the lead frame 10 that is disposed in the bonding stage 22 to heat the die pad 12. Wire-bonding can be accomplished by heating the die pad 12.

Alternatively, one of the die pads 12 of the lead frame 10 may be disposed in the bonding stage 22, or a plurality of the die pads 12 may be disposed therein. In other words, a plurality of the die pads 12 may be simultaneously disposed in the bonding stage 22 as long as the plurality of the die pads 12 of the lead frame 10 can be simultaneously brought in contact with the heat section 20 to be heated and wire-bonded. In this case, for example, a lead frame having a plurality of die pads 12 arranged in a matrix can be used.

In the bonding stage 22, the wire-bonding work is performed. In the wire-bonding work, electrodes (that are generally aluminum pads) of the semiconductor chip 14 are connected to portions (that are generally plated) of the leads 16 by a wire 19 that is passed through a tool 18. Generally, an aluminum pad is covered by a thin oxide film in the atmosphere. Therefore, the oxide film may preferably be broken to create solid-phase diffusion between the aluminum and gold. Therefore, the wire-bonding is conducted while the rear surface of the lead frame 10 is heated to about 200° C. by means of the heat section 20. Also, while the heating is conducted, pressure and ultrasonic vibrations may also be employed to conduct the wire-bonding work, as needed.

The heat section 20 is provided at least in the bonding stage 22. In other words, as shown in FIGS. 1–3, the heat section 20 may also be provided in the stand-by stage 24. In this case, with respect to the lead frame 10 that is disposed in the bonding stage 22 and the stand-by stage 24, as shown in FIG. 1, as compared to a surface of the heat section 20 facing the lead frame 10 in the bonding stage 22, a surface thereof in the stand-by stage 24 is set lower, such that the lead frame 10 disposed in the stand-by stage 24 can be maintained in a non-contact state with the heat section 20. In other words, even when the heat section 20 is provided in the stand-by stage 24, a part of the heat section 20 in the stand-by stage 24 can be placed in a non-contact state with the lead frame 10 disposed therein, and the arrangement is not limited to the above-described embodiment. Accordingly, even when the heat section 20 has to be provided in the stand-by stage 24 due to its system requirements, the lead frame 10 in the stand-by stage 24 can be transferred to the bonding stage 22 without being directly heated.

Also, a heat insulation member may be provided in the stand-by stage 24 together with the heat section 20. More specifically, a heat insulation member may be provided on the heat section 20 in the stand-by stage 24. As a result, while at least one of the die pads 12 of the lead frame 10 disposed in the bonding stage 22 is brought in contact with the heat section 20 to be heated and wire-bonded, the remaining die pads 12 of the lead frame 10 can be placed in contact with the insulation member. Accordingly, even in such a case, the lead frame 10 can be transferred to the bonding stage 22 without being directly heated in the stand-by stage 24.

In accordance with the present invention, while the die pad 12 disposed in the bonding stage 22 is wire-bonded, the die pads 12 in the stand-by stage 24 are placed in a non-contact state with the heat section 20. In other words, the heat of the heat section 20 for wire-bonding can be prevented from being directly applied to the lead frame 20 disposed in the stand-by stage 24. As a result, for example, the growth of an oxide film that may be formed in rear surfaces of the die pads 12 of the lead frame 10 can be suppressed, and the adhesion between the rear surfaces of the die pads 12 and the resin can be improved. Accordingly, highly reliable semiconductor devices can be manufactured.

A method for manufacturing a semiconductor device in accordance with an embodiment of the present invention is described below.

As shown in FIG. 2, the lead frame 10 having a plurality of the die pads 12 is transferred to the bonding stage 22 that has the heat section 20, and as shown in FIG. 1, at least one of the die pads 12 of the lead frame 10 is placed on the heat section 20 of the bonding stage 22. For example, after the die pad 12 disposed on the bonding stage 22 is brought in contact with the heat section 20 to thereby conduct a wire-bonding, the heat section 20 is temporarily lowered, some of the remaining die pads 12 disposed in the stand-by stage 24 are transferred to the bonding stage 22, the heat section 20 is raised, and the next wire-bonding work may be conducted. In the transfer, as shown in FIG. 2, rails 30 for supporting the lead frame 10 may be provided in a manner to support both of the outer sides of the lead frame 10 in its width direction. More specifically, the rails 30 may be provided in a manner to support both of the outer sides of the lead frame 10 in its width direction that is perpendicular to a direction in which the lead frame 10 is transferred. By the use of the rails 30, the rear surfaces of the die pads 12 in the stand-by stage 24 can be placed in a non-contact state with the heat section 20, while the die pad 12 disposed in the bonding stage 22 is wire-bonded. It is noted that the rails 30 may be affixed above the heat section 20, in a manner that the lead frame 10 passes the correct bonding position. As a result, the positioning of the lead frame 10 can be readily conducted for bonding over the bonding stage 22.

The die pad 12 disposed on the bonding stage 22 contacts the heat section 20 to be directly heated, and thereby the wire-bonding is performed. In the wire-bonding, the die pad 12 disposed on the bonding stage 22 is heated to temperatures, for example, over 200° C. (preferably, about 230° C.) for several ten seconds (for example for 20 seconds), to thereby electrically connect the electrodes of the semiconductor chip 14 and the leads 16 by the wire 19.

During this period, the remaining die pads 12 disposed in the stand-by stage 24 that are waiting to be transferred to the bonding stage 22 can wait without contacting the heat section 20. Therefore, since the die pads 12 disposed in the stand-by stage 24 are not directly heated, each one of the die pads 12 can be heated only when it is wire-bonded.

In accordance with the present invention, while the die pad 12 disposed in the bonding stage 22 is wire-bonded, the die pads 12 in the stand-by stage 24 are placed in a non-contact state with the heat section 20. In other words, the heat of the heat section 20 for wire-bonding can be prevented from being directly applied to the lead frame 20 disposed in the stand-by stage 24. As a result, for example, the growth of an oxide film that may be formed in rear surfaces of the die pads 12 of the lead frame 10 can be suppressed, and the adhesion between the rear surfaces of the die pads 12 and the resin can be improved. Accordingly, highly reliable semiconductor devices can be manufactured.

Figure 4:
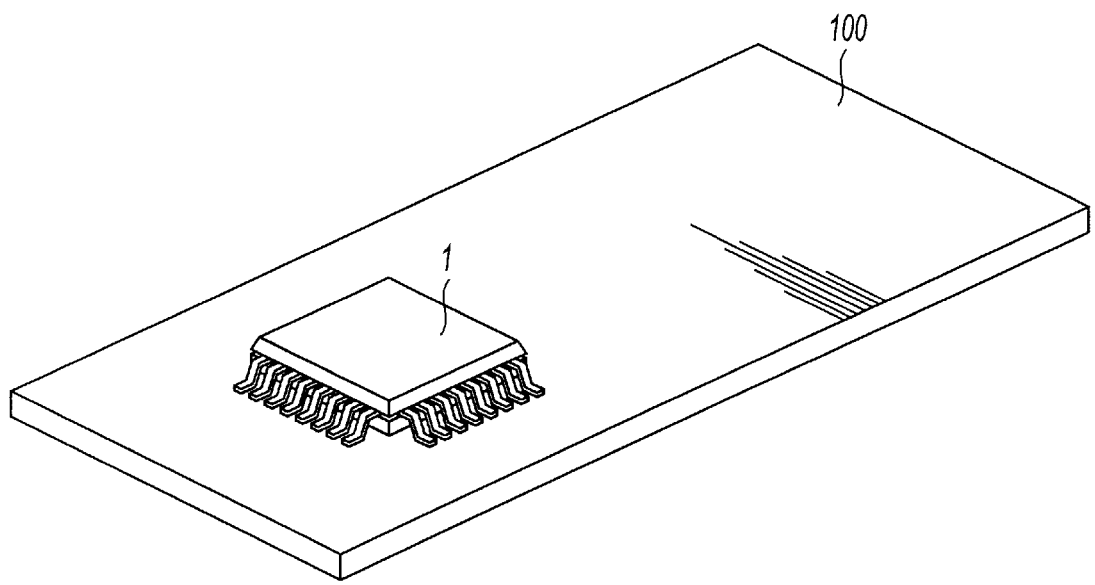
FIG. 4 is an illustration showing a circuit substrate that mounts a semiconductor device in accordance with the present invention.

FIG. 4 shows a circuit substrate 100 that is provided with a semiconductor device 1 in accordance with the present invention. An organic substrate, such as, for example, a glass epoxy substrate, is generally used as the circuit substrate. A wiring pattern composed of copper, for example, to define a designated circuit is formed on the circuit substrate. The wiring pattern and external terminals of the semiconductor device are mechanically connected to obtain electrical conduction thereof.

Figure 5:
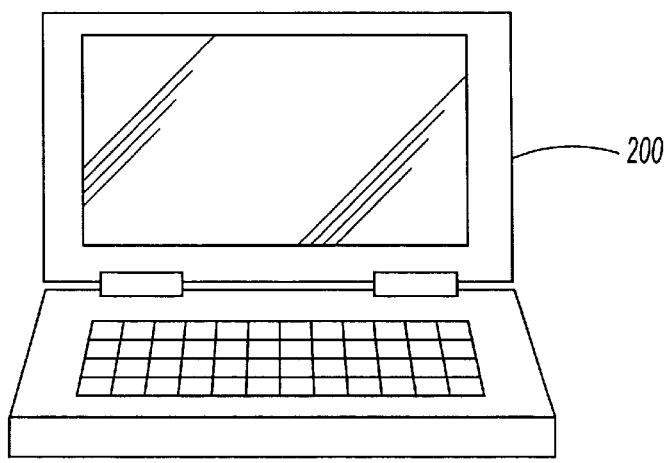
FIG. 5 is an illustration showing an electronic apparatus having a semiconductor device in accordance with the present invention.
Figure 6:
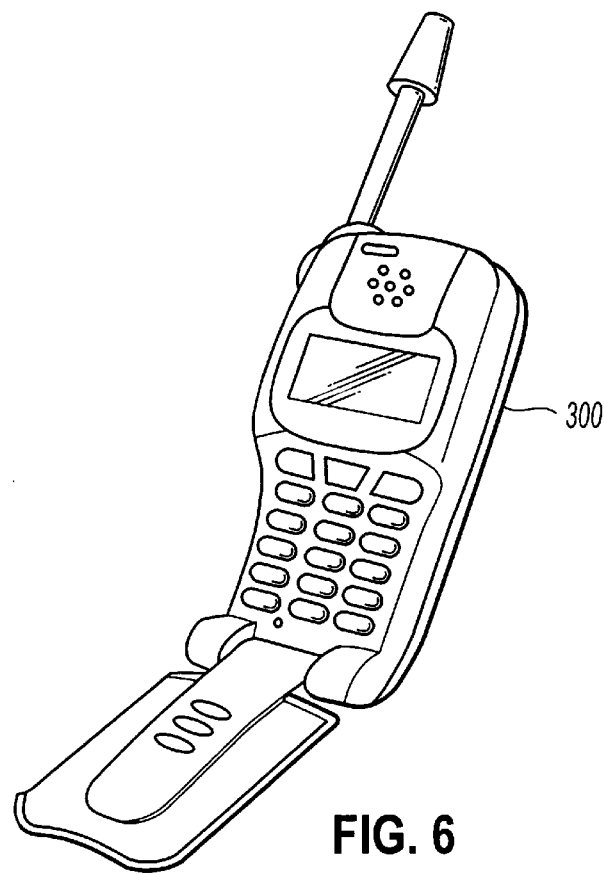
FIG. 6 is an illustration showing an electronic apparatus having a semiconductor device in accordance with the present invention.

Furthermore, as electronic apparatuses having semiconductor devices in accordance with the present invention, a notebook type personal computer 200 is shown in FIG. 5, and a cellular phone 300 is shown in FIG. 6.

What is claimed is:

1. A method for manufacturing a semiconductor, comprising the steps of:

disposing a lead frame having a plurality of die pads on which semiconductor chips are respectively mounted in a bonding apparatus, and wire-bonding electrodes of the semiconductor chips and leads of the lead frame, the bonding apparatus including a bonding stage and a stand-by stage, and a heat section is provided at least in the bonding stage among the bonding stage and the stand-by stage;

disposing at least one of the die pads of the lead frame in the bonding stage and remaining die pads in the stand-by stage; and placing the die pads disposed in the stand-by stage in a non-contact state with the heat section, while the at least one die pad disposed in the bonding stage is brought in contact with the heat section to be heated and wire-bonded.

2. The method for manufacturing a semiconductor device according to claim 1, side sections of the lead frame being supported to thereby place the die pads disposed in the stand-by stage in a non-contact state with the heat section.

3. The method for manufacturing a semiconductor device according to claim 1, the lead frame comprising copper.

4. A semiconductor device manufactured by the method for manufacturing a semiconductor device according to claim 1.

5. A circuit substrate comprising the semiconductor device according to claim 4 mounted thereon.

6. An electronic apparatus comprising the semiconductor device according to claim 4.

7. A manufacturing apparatus for manufacturing a semiconductor device, comprising:

a bonding stage for wire-bonding electrodes of semiconductor chips mounted on die pads of a lead frame with leads of the lead frame; and a stand-by stage for, while at least one of die pads of the lead frame is wire-bonded in the bonding stage, disposing remaining die pads of the lead frame, a heat section being provided at least in the bonding stage among the bonding stage and the stand-by stage, and when the heat section contacts the at least one of the die pads of the lead frame disposed in the bonding stage, the heat section being placed in a non-contact state with the remaining die pads of the lead frame disposed in the stand-by stage.

8. The manufacturing method for manufacturing a semiconductor device according to claim 7, the heat section being provided in the bonding stage and stand-by stage, and the heat section comprising a first surface opposing the lead frame in the stand-by stage that is lower than a second surface opposing the lead frame in the bonding stage.

* * * * *